United States Patent [19]

Shum

[11] 4,130,796
[45] Dec. 19, 1978

[54] CALIBRATING AND MEASURING CIRCUIT FOR A CAPACITIVE PROBE-TYPE INSTRUMENT

[75] Inventor: Lanson Y. Shum, Salem Township, Allegheny County, Pa.

[73] Assignee: Westinghouse Electric Corp., Pittsburgh, Pa.

[21] Appl. No.: 858,320

[22] Filed: Dec. 7, 1977

[51] Int. Cl.² ............................................ G01R 27/26
[52] U.S. Cl. .................................. 324/61 R; 73/1 R; 324/130
[58] Field of Search ..................... 324/61 R, 61 P, 74, 324/130; 73/1 J, 1 R

[56] References Cited
U.S. PATENT DOCUMENTS

| 3,531,977 | 10/1970 | Chaskelis et al. | 73/1 R |
| 4,086,528 | 4/1978 | Walton | 324/61 R |

Primary Examiner—Stanley T. Krawczewicz
Attorney, Agent, or Firm—J. J. Wood

[57] ABSTRACT

A calibrating and measuring circuit is disclosed for a capacitive probe-type instrument. The capacitive probe, in contact with a surface to be measured, is connected to an oscillator which generates pulses, the frequency of which is adjustable, the number of pulses generated being a function of the texture of the surface being measured. A digital counter is connected to receive, count and present the resulting summation to a visual numerical display.

In order to calibrate the instrument the capacitive probe is placed on a known specimen, the digital magnitude of which is loaded into the counter through a number of thumb switches. The counter first counts down to this number, and then counts up to the number of remaining pulses. The resulting count, called the offset number, is then transferred to a memory. During measurement the memory loads the offset number into the counter, the counter then counting the offset number down to zero, before counting up to the amount of the received pulses, which are then displayed. A logic arrangement initiates and controls both calibration and measurement.

6 Claims, 5 Drawing Figures

CALIBRATING AND MEASURING CIRCUIT FOR A CAPACITIVE PROBE-TYPE INSTRUMENT

CROSS-REFERENCE TO RELATED APPLICATION

See copending application entitled APPARATUS FOR GAUGING THE TEXTURE OF A CONDUCTING SURFACE, Ser. No. 723,269 filed on Sept. 15, 1976, in the names of Robert E. Fromson, James N. Brecker and Lanson Y. Shum.

BACKGROUND OF THE INVENTION

1. Field of the Invention

This invention relates to an improved calibration circuit for a capacitive probe-type surface texture measuring instrument.

2. Description of the Prior Art

The circuit in the above-referenced copending application describes a calibration and measurement arrangement to ensure the correct linearity between a magnitude on a visual numeric display and the magnitude of specimens being measured. The application describes the adjustment of two parameters: one which changes the slope of the straight line provided by two or more plotted measurements, and the other an offset adjustment which, in effect, moves this line up or down in a parallel family of lines.

The circuitry in the copending application also has some vulnerability from spurious 60 Hz power hum picked up by the measuring probe, the human hand and even the workpiece. These hums are the result of stray capacitive coupling which can be minimized but not completely eliminated. As a result the 60 Hz hum modulates the measuring oscillator such that, if the period is not exactly a multiple of 1/60 seconds, the contents of the counter used in measurement will jitter in a random fashion making the last digit of the three-digit display inconsistent.

SUMMARY OF THE INVENTION

A calibrating and measuring circuit is provided for a capacitive probe instrument. Oscillator means, coupled to the capacitive probe, generate pulses of an adjustable frequency. Generating means develop a signal having a time period $T_M$ which is an exact multiple of one over the frequency of the power supply. Means, connected to the oscillator output, digitally count these pulses up and down. The counting means has an enabling input, a count command input and a borrow output which is delivered when the counting means reaches zero. Means, having an enabling input, are connected to the output of the counting means to digitally display the digital contents of the counting means at the end of the time period $T_M$. Means are coupled to the counting means for storing an offset digital number. Means are provided for generating a digital number in the calibrating mode. Multiplexer means are connected to receive the outputs of the storing means and the digital number means during measuring and calibrating, respectively, the multiplexer means having calibration and measurement mode enabling inputs, and also having a data output link connected to the counting means. Logic control means, initiated upon receiving the signal of period $T_M$ are connected to the multiplexer means to determine whether data shall flow from the digital number signal or the storing means. The logic control means is also connected to the enabling inputs of the counting means and the digital display means. The logic control means generates down count signals upon the initiation of the period $T_M$ which it sends to the count input of the counting means. The logic control means also receives the borrow signals from the counting means when it reaches zero counts, and generates up count commands which are sent to the count command input. The logic control means includes switching means for changing from calibration to measurement. The logic control means enables the storing means to receive the digital presentation of the counting means during calibration at the end of the period $T_M$ to store the offset number. In the process of calibration, the counting means first counts down to the digital input number from the digital number generating means. The counting means then counts up to a finite number which is then presented to the storing means for storage at a $T_M$ period when calibration is completed, and this becomes the offset number remembered by the storing means. Upon the subsequent measurement testing of unknown specimens, the counting means will first count down to this offset number, before counting up in accordance with the number of pulses received from the oscillator means.

DESCRIPTION OF A PREFERRED EMBODIMENT

Figure 1:
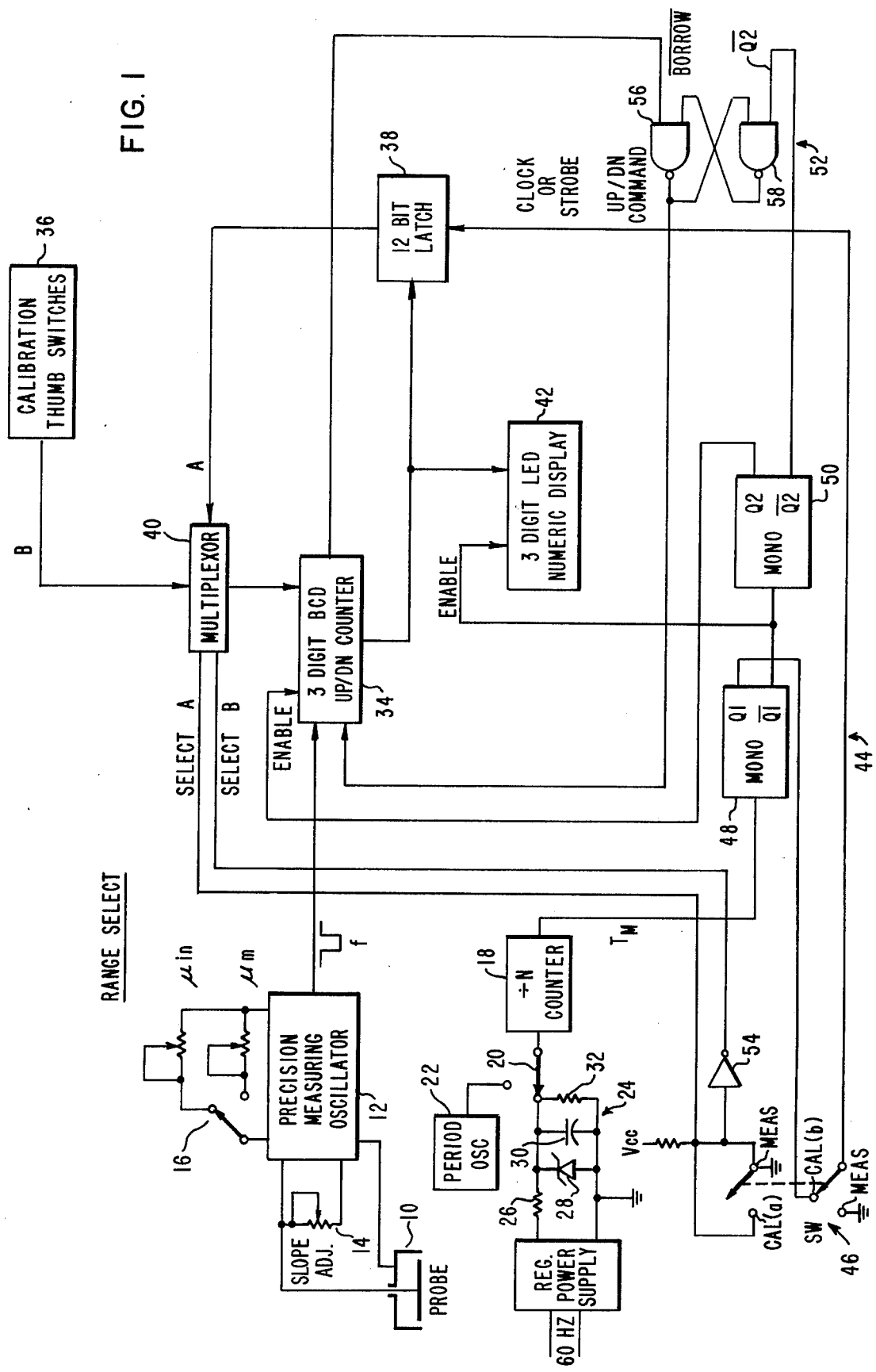
FIG. 1 is an electrical block diagram of the improved calibrating and measuring circuit in accordance with the invention for use with a capacitive-type probe instrument.

Referring now to FIG. 1, a capacitive probe 10 in contact with a surface to be measured, periodically discharges through an oscillator circuit indicated symbolically at 12, to provide a sequence of pulses having a frequency $f_1$, the number of pulses generated being a function of the surface texture, i.e. the higher the number the coarser the surface texture and conversely. (The probe 10 may be of the type described in the copending application entitled APPARATUS FOR GAUGING THE TEXTURE OF A CONDUCTING SURFACE, Ser. No. 723,269, filed on Sept. 15, 1976, in the names of Robert E. Fromson, James N. Brecker and Lanson Y. Shum.

As will presently be explained, the relationship between the number of pulses and the surface being measured is linear, so the oscillator 12 includes a slope adjustment potentiometer 14 for calibration. The instrument may be calibrated in $\mu$ inches of $\mu$ meters, and so includes a range selection network 16.

A divide-by-N counter 18 provides a square wave of period $T_M$ to define and discipline the period of measurement. By use of a switch 20, the N counter 18 can be connected to a period oscillator 22 if a 60 Hz supply is not available. In field applications where a 60 Hz power supply is available, the switch 20 is connected to a circuit indicated generally at 24 which converts the usual 120 V 60 Hz supply to a 15 V peak-to-peak 60 Hz input to the N counter 18. The circuit 24 comprises an input resistor 26 in series with a parallel combination comprising Zener diode 28, capacitor 30 and resistor 32. The incoming signal amplitude is clipped by resistor 26 and Zener diode 28. The small capacitor 30 and drain resistor 32 remove any line transient which may false-trigger counter 18.

The pulses $f_1$ from the precision oscillator 12 are applied to a three-digit binary-coded decimal (BCD) up-down counter 34. As will be explained presently, an offset number from either a calibration source of digital thumb switches 36 or a 12-bit store or latch 38 enters counter 34 through a multiplexer or switch 40. Multiplexer 40 has two selection or enabling inputs select A and B which enable the digital information from channel A (i.e. latch 38) or channel B (i.e. thumb switches 36) to enter counter 34.

The contents of the digital counter 34 are presented to the latch 38 and to a three-digit light-emitting diode (LED) numeric display indicated at 42.

The instrument is under the discipline of a control logic means indicated generally at 44. The control logic 44 comprises a switching arrangement indicated generally at 46, a pair of monostable multivibrators 48, 50 and an RS flip-flop indicated generally at 52.

The switching means 46 comprises a ganged switch SW (a) (b) having two pairs of pole positions for calibration and measurement, and an inverter 54. A voltage source Vcc is connected to both the calibration and measurement poles of the upper portion (a) of the switch SW as shown; the input of inverter is also connected to the same pole pair calibration and measurement respectively. The monostable multivibrator 48 has the outputs $Q_1$ and $\overline{Q}_1$ and the monostable multivibrator 50 has the outputs $Q_2$ and $\overline{Q}_2$.

The RS flip-flop 52 comprises NAND gates 56, 58 interconnected as shown. One input to NAND gates 56 is a $\overline{BORROW}$ signal from the counter 34. The NAND gate 58 has the $\overline{Q}_2$ output of multivibrator as one of its inputs.

OPERATION OF THE ILLUSTRATIVE EMBODIMENT OF FIG. 1

Before using the instrument, it should first be calibrated. With the aid of the waveforms of FIG. 2, the overall operation in the calibration and measurement modes will now be described. The switch SW is moved to the calibration post in the (a) and (b) portions of the switch respectively. In this position, the calibration post in portion (a) is at ground (low or LOGIC ZERO), and the calibration post in portion (b) is connected to the $Q_1$ output of MONO 48. The logic ZERO input to inverter 54 is inverted to a ONE. Select A input to multiplexer 40 is ZERO and select B is ONE. Thus channel B of multiplexer 40 is enabled, and any number dialed in by the digital thumb switches 36 will be loaded into the multiplexer 40. Channel A is now disabled.

Figure 2:
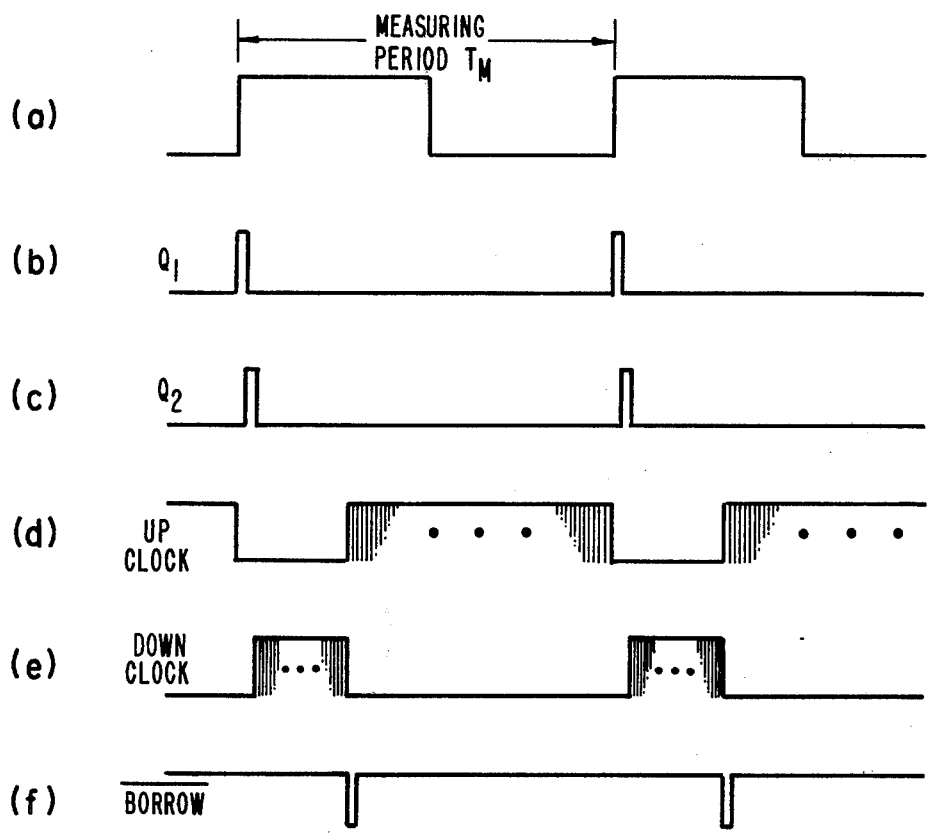
FIG. 2 is a number of waveforms (a), (b), (c), (d), (e), and (f) used on explaining the operation of the circuit of FIG. 1.

The output FIG. 2:a of the divide-by-a-counter 18 is a square wave having a time period $T_M$ which defines and disciplines the measuring period. As the wave $T_M$ goes high (LOGIC ONE), this is applied to the MONO 48 which outputs $Q_1$ = ONE (FIG. 2(b) and $\overline{Q}_1$ = ZERO. The $Q_1$ = ONE signal passes through portion (b) of SW to latch 38, which then stores the output of counter 34 which has the accumulated value of the previous sampling period.

$\overline{Q}_1$ = ZERO goes to two locations: (a) the enable of numeric display 42 and (b) to the input of MONO 50 (at the moment the $\overline{Q}_1$ = ZERO keeps the display 42 disabled). At the end of the $\overline{Q}_1$ pulse, $\overline{Q}_1$ returns to a "ONE". The $\overline{Q}_1$ = ONE triggers MONO 50 which then produces outputs $Q_2$ = ONE, $\overline{Q}_2$ = ZERO.

The pulse $Q_2$ = ONE enables the counter 34 to preset to an offset number which is loaded in from the multiplexer 40. (This offset number will be the number dialed in by the thumb switches 36.)

The pulse $\overline{Q}_2$ = ZERO is applied to the RS flip-flop 52 to reset the flip-flop by changing the output of NAND 56 to a ZERO which is applied to counter 34 to command it to count down (FIG. 2(e)).

The offset number in the counter 34 is a positive number and the counter 34 counts down toward ZERO at which time a $\overline{BORROW}$ = ZERO is generated (FIG. 2(f)) by the counter 34. This causes NAND gate 56 to output a ONE, i.e. both its inputs are ZEROS; this logic ONE now commands the counter 34 to count UP (FIG. 2(d)). The counter 34 counts up, and the number of UP counts will be the number of pulses received from oscillator 12.

The numerical counts in the counter 34 is presented to both the latch 38 and the numeric display 42. At the end of the calibration period $T_M$, the divide-by-N counter 18 again goes HIGH and, as previously explained, MONO 48 generates $Q_1$ = ONE to enable the latch 38 to accept the contents of the BCD counter 34. $\overline{Q}_1$ = ZERO enables the display 42 to store and display the output of counter 34. The numeric display is a function of the number of pulses generated by the precision oscillator 12, this number in turn being a function of the texture of the surface being measured. $\overline{Q}_1$ = ZERO signal lasts only 100 $\mu$sec.

While the probe is still on the calibration specimen, the switch SW moves to the measurement posts in portions a and b; this makes SELECT A a logic ONE since it is at a potential of Vcc and, after inversion by inverter 54, the ONE becomes a ZERO so that SELECT B is a ZERO. The multiplexer 40 will now only receive and output the offset numbers through channel A from the latch store 38.

When the measurement cycle begins the square wave is a ONE. This causes MONO 48 to generate $Q_1$ = ONE, $\overline{Q}_1$ = ZERO. $Q_1$, the store probe, is now removed from the latch store 38, by reason of the grounded position of the SW(b).

$\overline{Q}_1$ = ZERO goes to the numeric display enabling the display to store the content of counter 34 of the previous sample. $\overline{Q}_1$ = ZERO also triggers the MONO 50, causing it to output $Q_2$ = ONE, $\overline{Q}_2$ = ZERO.

$Q_2$ = ONE enables the counter 34 and it accepts the offset number in latch 38, through the multiplexer 40. $\overline{Q}_2$ = 0 causes the RS flip-flop 52 to output a ZERO which commands the counter to count down. When $Q_2$ = ZERO, $\overline{Q}_1$ = ONE, this triggers MONO 50 to output $\overline{Q}_2$ = ONE, $Q_2$ = ZERO. $Q_2$ = ZERO disables the counter 34 from receiving a further input from the multiplexer 40. $\overline{Q}_2$ = ZERO goes to the RS flip-flop 52, causing NAND 56 to output ZERO which commands the counter 34 to count down. The RS flip-flop is now in condition so that when $\overline{BORROW}$ = ZERO arrives, the RS flip-flop 52 will change its output to a ONE to command up counting.

The counter 34 counts to zero and sends a $\overline{BORROW}$ = ZERO to the RS flip-flop 52 and it outputs a logic ONE which commands the counter 34 to count up. The counter 34 continues to count up in accordance with the number of pulses received from the oscillator 12. At the end of the measuring period $T_M$, just as a new measuring period is beginning, $\overline{Q}_2$ = ONE and the display indicates visually the contents of the counter. If the probe is still on the calibration specimen, which has the same reading as the thumb-switch setting, the display should show the value of the thumb-switch setting.

CALIBRATION PROCEDURE

The calibration procedure can readily be accomplished by using two standards which have an acceptable finish. For example, suppose we have a 50μ inch specimen and a 125μ inch specimen. These standards can be obtained by carefully measuring with some other instrument such as a stylus or a laboratory profilometer or it may be simply a standard piece of known value.

STEP 1

Figure 3:
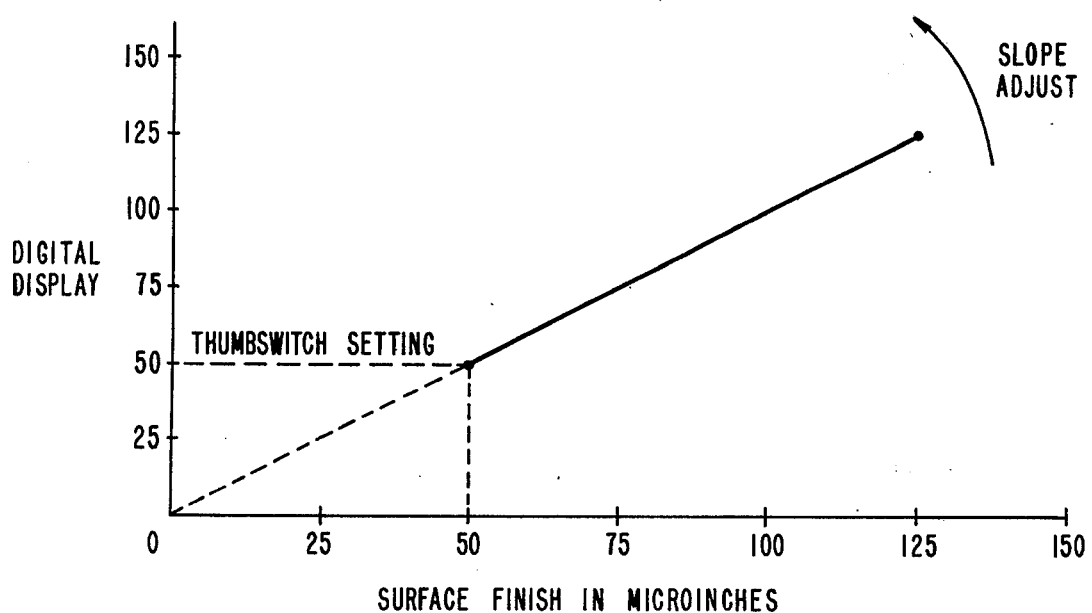
FIG. 3 is a diagram used in explaining how the circuitry of FIG. 1 is calibrated for direct reading.

Referring now to FIGS. 1 and 3, the switch SW is moved to calibration. The magnitude of the calibration specimen in μ inches or μ meters is dialed in by means of the digital thumb switches 36, for example 50μ inches. The probe 10 is placed on the 50μ inch specimen. When the display shows a steady reading, the switch SW is switched to measurement, and the display 42 should read 50.

STEP 2

The probe 10 is placed on a second specimen, say 125μ inches. The switch SW is still on measurement and the display should read exactly 125. If it does not, the slope is adjusted by potentiometer 14 to increase or decrease the reading as required.

The calibration procedure Steps 1 and 2 are repeated until the display reads the two specimens accurately, i.e. 50μ inches and 125μ inches. The potentiometer 14 is then locked in position.

This calibration procedure is performed about once a month to ensure continued accuracy or whenever some condition has been changed such as when a new probe type is used or the like.

When the instrument is turned on and warmed up for a few minutes, a calibration standard piece is used to set the latch 38 by using Step 1 described above. The instrument is now ready for use. The stored value of latch 38 will be lost as soon as power is turned off. A standard calibration specimen of accurately known value is therefore included with the instrument.

In order to further clarify the role of the offset number, reference will now be made first to FIG. 4A and then to FIG. 4B.

Figure 4A:
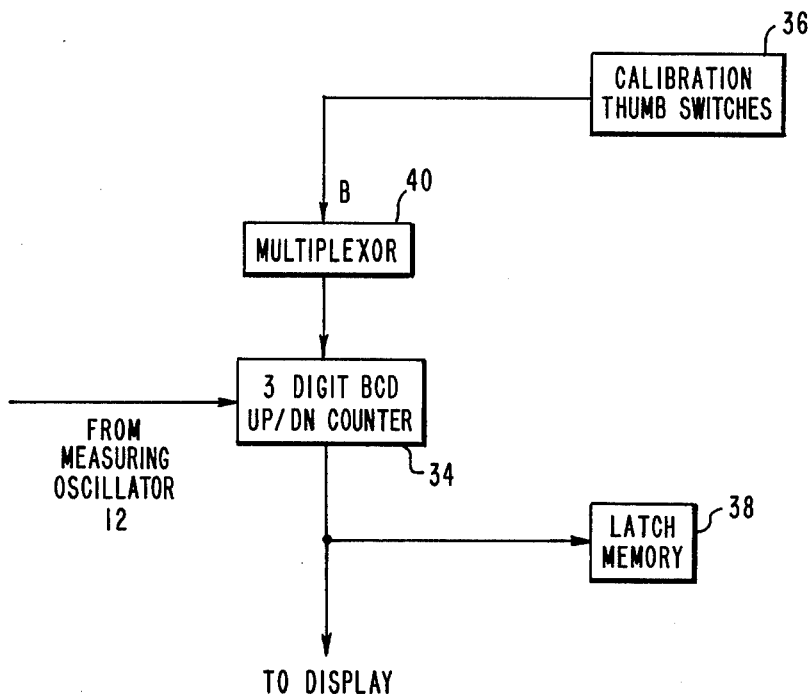
FIGS. 4A and 4B are diagrams used in explaining the role of the offset number in measurement in accordance with the invention.

In FIG. 4A, during calibration, assume that a 10μ inch specimen is being used and 10 is dialed by using the thumb switches 36. This is loaded into the counter 34 through channel B. Assume that 75 pulses are being sent to the counter 34 from the oscillator 12. The counter "consumes" 10 pulses to count down to zero and then it counts up to 65 which is sent to the display and to the latch-memory 38 which then stores 65.

Figure 4B:
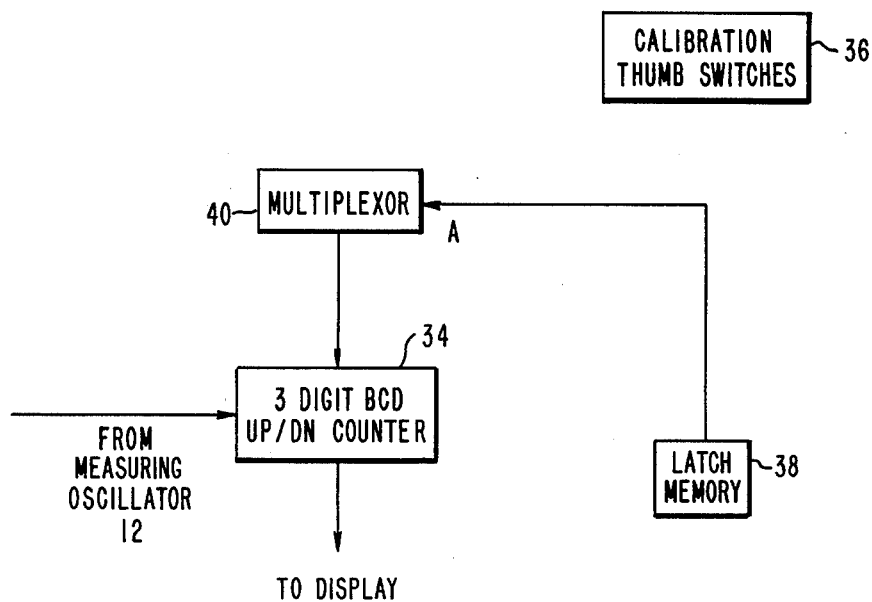

Referring now to FIG. 4B, during measurement, only channel A is enabled, and latch-memory 38 enters 65 into counter 34 as the offset number. The oscillator 12 still sends 75 pulses to the counter 34 which counts down to 65, consuming 65 of the input pulses and then counts up for the remaining 10 pulses. The counter 34 will then present 10 to the display 42, which is the desired result.

I claim:

1. A calibrating and measuring circuit for a capacitive probe instrument comprising:

(a) means coupled to said capacitive probe for generating pulses of an adjustable frequency;

(b) means for generating a signal having a time period $T_M$ which is an exact multiple of one over the frequency of the power supply;

(c) means, connected to receive said pulses, for digitally counting up and down, said counting means having an enabling input, a count command input, and a borrow output which is delivered when said counting means reaches zero;

(d) means having an enabling input, connected to the output of said counting means, to display the digital contents of said counting means at the end of period $T_M$;

(e) means, coupled to said counting means, for storing an offset digital number;

(f) means for generating a digital number signal in the calibration mode;

(g) multiplexer means connected to receive the outputs of said digital number means and said storing means during calibration and measurement, respectively, said multiplexer means having calibration and measurement mode enabling inputs, and having a data output connected to said counting means;

(h) logic control means connected to receive said time period $T_M$ signal as an input, said logic control means being connected to said multiplexer means to respectively enable and disable said multiplexer means for calibration and measurement, said logic means being connected to the enable inputs of said counting means and said display means, said logic means being also connected to said count command input and to said borrow output of said counting means, said logic control means sending a down count command to said count command input upon receiving said $T_M$ signal, and sending an UP count command to said command input upon receiving said borrow signal, said logic control means being connected to said offset digital storing means to command the storage of the digital contents of said counting means at the end of the period $T_M$, so that during measurement said stored number is the offset number which said counting means must first count down to zero before beginning to count up the pulses received from said oscillator means.

2. A calibrating and measuring circuit according to claim 1 wherein said means for generating the $T_M$ signal comprises a line source of a.c. voltage, a clipping circuit and a divide-by-N counter, where N is any convenient number, the line source being connected to said clipping circuit, the output of said clipping circuit being connected to said divide-by-N counter, the output of the N counter being a square wave having the period $T_M$ equal to the frequency of the line source divided by N.

3. A calibration and measuring circuit according to claim 1 wherein said means for generating the $T_M$ signal comprises an oscillator and a divide-by-N counter, said oscillator having a frequency exactly equal to the ambient environmental line voltage source, and N is any convenient number, the output of the oscillator being connected to the input of the N counter, the output of the N counter being a square wave having the period $T_M$ equal to the frequency of the ambient environmental line source divided by N.

4. A calibration and measuring circuit according to claim 1 wherein said logic control means comprises switching means, first and second monostable multivibrators and an RS flip-flop, said first monostable multivibrator having outputs $Q_1$ and $\overline{Q}_1$, said second monostable multivibrator having outputs $Q_2$ and $\overline{Q}_2$, said first monostable multivibrator having an input connected to receive said $T_M$ signal, said $\overline{Q}_1$ output being connected to the enable input of said display means and to the input of said second monostable multivibrator, said $Q_2$ output being connected to the enable input of said counting means, said RS flip-flop having two inputs and an output, one connected to said $\overline{Q}_2$ output and the other to the borrow output of said counting means, the RS flip-flop output being connected to the count command input of said counting means, said switching means having calibration and mesurement selection positions, coupled to said multiplexer means to enable the multiplexer means to selectively pass the digital contents of said offset digital number storing means and said digital number generating means to said counting means, respectively, said switching means in the calibrating mode, connecting said $Q_1$ output to said digital number storing means to command the instantaneous storage of the digital contents of the counting means therein.

5. A calibration and measuring circuit according to claim 1 wherein said means for generating digital number signals comprises thumb switches which can be dialed to selected numerical settings.

6. A calibrating and measuring circuit for a capacitive probe instrument comprising:
   (a) means for oscillation coupled to said capacitive probe for generating pulses of an adjustable frequency;
   (b) means for generating a signal having a time period $T_M$ comprising a line source of a.c. voltage having a frequency f, a clipping circuit, and a divide-by-N counter, where N is any convenient number, the line source being connected to said clipping circuit, the output of said clipping circuit being connected to said divide-by-N counter, the output of the divide-by-N counter being a square wave having the period $T_M$ equal to f divided by N;
   (c) means, connected to receive said pulses, for digitally counting up and down, said counting means having an enabling input, a count command input, and a borrow output which is delivered when said counting means reaches zero;
   (d) means having an enabling input, connected to the output of said counting means, to digitally display the contents of said counting means at the end of the period $T_M$;
   (e) means, coupled to said counting means for storing an offset digital number;
   (f) means for generating a digital number signal in the calibrating mode;
   (g) multiplexer means connected to receive the outputs of said digital number means and said storing means during calibration and measurement, respectively, said multiplexer means having calibration and measurement mode enabling inputs, and having a data output connected to said counting means;
   (h) a first monostable multivibrator having an input connected to receive said $T_M$ signal, and having outputs $Q_1$ and $\overline{Q}_1$;
   (i) a second monostable multivibrator having an input connected to receive said output $\overline{Q}_1$, and having outputs $Q_2$ and $\overline{Q}_2$, said $\overline{Q}_1$ output being connected to the enable input of said digital display means;
   (j) an RS flip-flop means having inputs connected to receive said borrow signal and said $\overline{Q}_2$ output signal, and an output connected to said count command input of said counting means;
   (k) switching means having calibration and measurement selection positions, coupled to said multiplexer means, to enable the multiplexer means to selectively pass the digital contents of said offset digital number storing means and said digital number generating means to said counting means, said switching means in the calibration position connecting said $Q_1$ output to said digital number storing means to command the storage therein of the instantaneous contents presented by the counting means.

* * * * *